United States Patent [19]
Hendrickson

[11] Patent Number: 4,600,969
[45] Date of Patent: Jul. 15, 1986

[54] PROTECTIVE APPARATUS FOR ENCAPSULATING ELECTRICAL CIRCUITS

[76] Inventor: Max S. Hendrickson, 1167 N. Shore Trail, Forest Lake, Minn. 55025

[21] Appl. No.: 628,392

[22] Filed: Jul. 6, 1984

[51] Int. Cl.$^4$ .............................................. H05K 1/14
[52] U.S. Cl. .............................. 361/395; 174/52 PE;
361/399; 361/420
[58] Field of Search .......................... 174/52 PE, 52 S;
361/380, 394, 395, 399, 417, 420; 338/275

[56] References Cited
U.S. PATENT DOCUMENTS
4,292,590 9/1981 Wilson .............................. 174/52 PE
4,345,290 8/1982 Johnson ................................ 361/56

Primary Examiner—A. D. Pellinen
Assistant Examiner—Gregory D. Thompson
Attorney, Agent, or Firm—Kinney & Lange

[57] ABSTRACT

An encapsulating apparatus for protecting an electrical circuit, the electrical circuit comprising a plurality of discrete electrical components supported on a circuit board and connected electrically to each other and to external electrical lead lines. The encapsulating apparatus comprises an imperforately walled hollow container defining oppositely first and second openings through the wall thereof. The container further comprises internal support means for receiving and positioning the electrical components in a predetermined relationship to the container and to each other with the lead lines extending outwardly through the first opening. The second opening is completely closed by a cap having a portion corresponding in size and configuration to said second opening. The cap further comprises at least one irregularly shaped arm projecting into the container when the cap is in closing relationship to the second opening, positively fixedly positioning the components in their predetermined relationship. The cap is further retained in closed relationship with respect to the second opening by an epoxy or other suitable means. The container is then substantially filled by a potting compound which is applied as a fluid and hardens rigidly. When the liquid potting compound solidifies, the electrical components are permanently sealed within the container.

12 Claims, 8 Drawing Figures

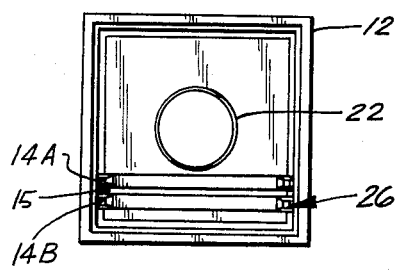
Fig. 4
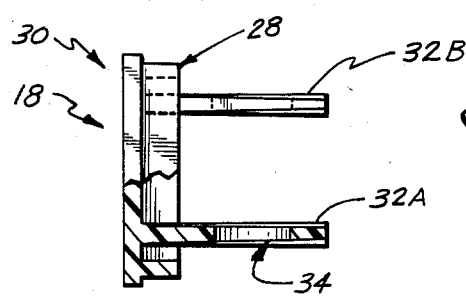
Fig. 5
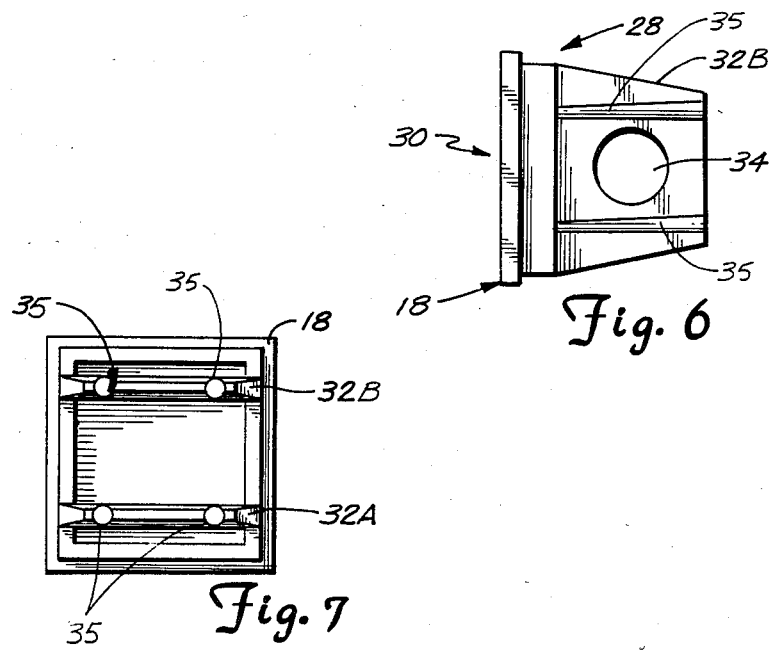
Fig. 6
Fig. 7
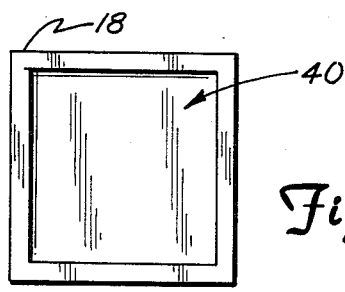
Fig. 8

PROTECTIVE APPARATUS FOR ENCAPSULATING ELECTRICAL CIRCUITS

BACKGROUND OF THE INVENTION

1. Field of the Invention

The present invention relates to a method of and protective apparatus for insulatively encapsulating electrical circuits.

2. Description of the Prior Art

Protective housings for electrical circuits have been employed in the past. For example, U.S. Pat. No. 4,345,290 to Johnson shows a plastic housing for electrical elements disposed and potted therein to provide both electrical insulation and mechanical protection from the environment. The housing is a hollow enclosure defining first and second openings through its walls, the first opening having internal threads. The electrical elements are inserted into the housing through the first opening. A cylindrical cap member has an externally threaded first end of a diameter dimensioned to fit within said housing first opening, to engage the threads therein. When threaded into the first opening, the cap member effectively retains the electrical components within the housing. However, Johnson does not provide a means for fixing the position of the circuit elements within the housing in a predetermined relationship. Because the circuit elements may be displaced and subsequently damaged when the insulative potting compound is injected into the capped housing, there is a need to find an encapsulating apparatus which effectively fixes the position of the circuit elements within the housing prior to introduction of the potting compound.

SUMMARY OF THE INVENTION

The present invention is a new type of protective electrical circuit encapsulating apparatus which fixes the position of the circuit components within the container prior to the introduction of potting compound, and a method for encapsulating the electrical circuit.

The encapsulating apparatus of the present invention comprises an imperforately walled hollow container or housing defining oppositely disposed first and second openings. An electrical circuit comprising a plurality of discrete electrical circuit components connected electrically to each other and to external electrical lead lines, is directed into the container through the second opening. An internal support mechanism receives and positions the electrical components in a predetermined relationship to the container and each other with the lead lines extending outwardly through the container first opening to connect the encapsulated circuit to other circuits or apparatus.

After the electrical circuit components have been inserted into the container, the second opening is completely closed by a cap having a portion of corresponding size and configuration. This cap further comprises at least one irregularly shaped arm projecting into the container when the cap is in closing relationship to the second opening. The arm positively fixes the position of the components in their predetermined relationship.

An insulative potting compound, preferably a liquid which hardens into a solid, is introduced into the container through the first opening until the container is substantially filled. The insulative potting compound encompasses the arm and components, thereafter hardening around said arm and components to permanently fix and seal the circuit components within the container.

The internal support and cap arm of the present invention stabilize the circuit components in place prior to the introduction of the potting compound into the container. This prevents damage to the circuit components due to displacement of the components by the force of the injected potting compound.

The present invention also includes a method for assembling the encapsulating apparatus. An imperforately walled hollow container is formed defining first and second oppositely disposed openings through its walls. An internal support mechanism in the container receives and positions the electrical components and lead lines in a predetermined relationship to the container and to each other, with the lead lines extending outwardly through the second opening. A cap member is attached to the housing to completely close the second opening of the container. A potting compound is then injected into the container to substantially fill the same.

DESCRIPTION OF THE DRAWINGS

FIG. 4 is a rear view of the container, looking through a second opening to a first opening;

FIG. 5 is a top view of a cap member for installation on the container, with parts in section and parts broken away;

FIG. 6 is a side view of the cap member;

FIG. 7 is a front view of the cap member; and

FIG. 8 is a rear view of the cap member.

DETAILED DESCRIPTION OF THE PREFERRED EMBODIMENTS

Figure 1:
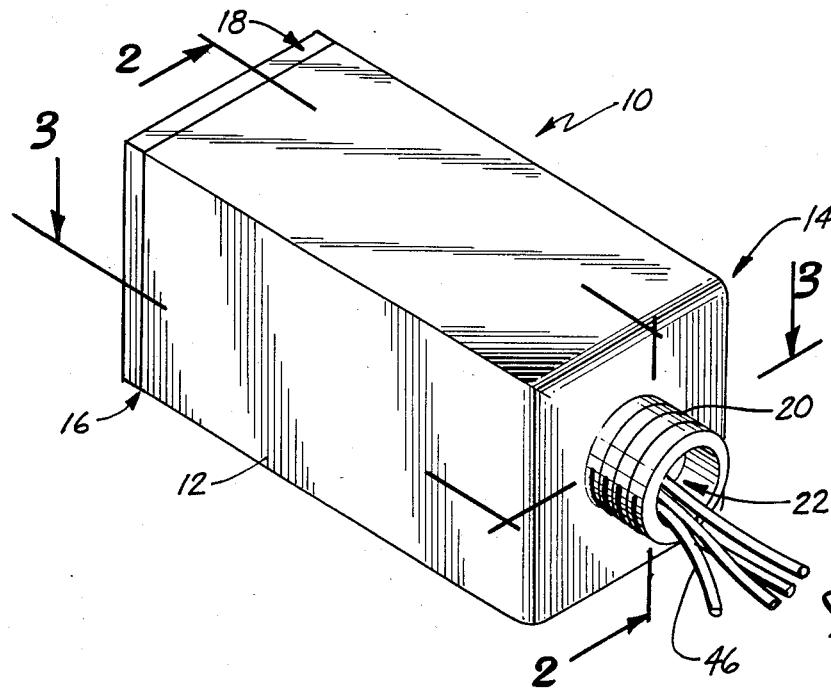
FIG. 1 is a perspective view of the encapsulating apparatus of the present invention.

A preferred embodiment of the encapsulating apparatus of the present invention is generally shown at 10 in FIG. 1. The encapsulating apparatus protects an electrical circuit which comprises a plurality of discrete electrical components connected electrically to each other and to external electrical lead lines 46 (which are typically metal wires with plastic insulator coatings or sleeves). The encapsulating apparatus includes a walled hollow container or housing 12 defining a first opening 22 in a first wall and an oppositely disposed second opening 24 in a second wall. It is also preferred that the container 12 further comprise an outwardly projecting, externally screw threaded neck 20 coincident with the first opening 22.

Container 12 further includes an internal support mechanism 26 for receiving and positioning the electrical components in a predetermined relationship to the container 12 and to each other, with the lead lines extending outwardly through the first opening 22.

Figure 2:
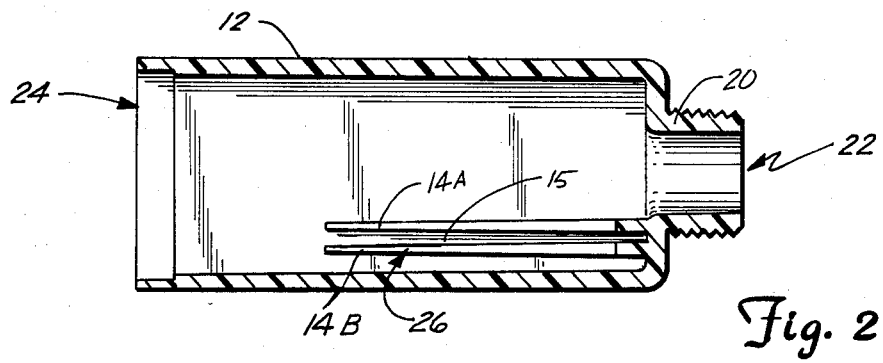
FIG. 2 is a vertical side sectional view of an empty encapsulating container forming part of the apparatus taken on the line 2—2 of FIG. 1.
Figure 3:
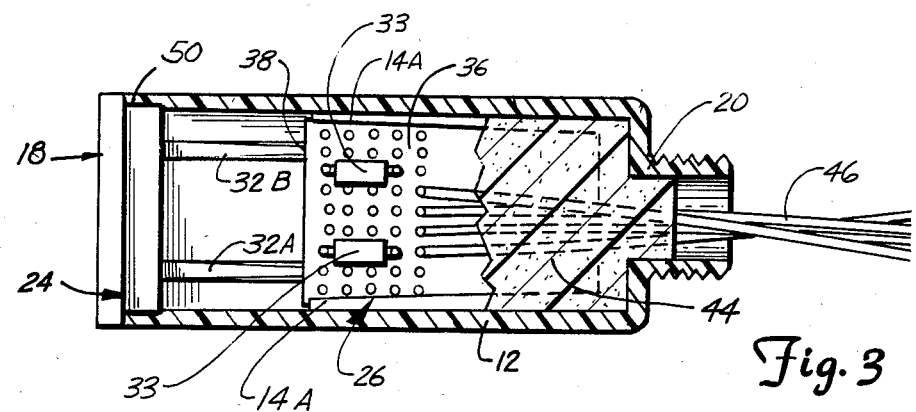
FIG. 3 is a sectional top view taken on the line 3—3 of FIG. 1, with parts in section and parts broken away.

The electrical circuit components 33 are preferably connected electrically by a circuit board, as shown by 36 in FIG. 3, or by other suitable means. As shown in FIGS. 2 and 3, internal support 26 preferably extends outwardly with respect to the inner walls of container 12. To properly support circuit board 36, support 26 includes two U-shaped substantially parallel flange members 14A and 14B integrally molded as part of the inner wall of container 12. Circuit board 36 is inserted through second opening 24 and between flanges 14A and 14B. Flanges 14A and 14B are further tapered such that a gap 15 created between flanges 14A and 14B narrows from second opening 24 toward the first opening 22 as shown in FIG. 4. The gap 15 at the narrowest end adjacent first opening 22 is slightly less than the height of circuit board 36. Thus, it is desirable for flanges 14A and 14B to spread slightly as circuit board 36 is inserted into support 26. The inherent memory of flanges 14A and 14B cause them to tightly grasp circuit board 36 once it is in place. It is also preferred that support 26 is substantially axially aligned with first opening 22 and second opening 24, and tangential to the periphery of the neck 20, as shown in FIG. 2.

Lead lines 46 connected to circuit board 36 are directed through neck 20 and serve to connect the electrical circuit carried by circuit board 36 to other electrical circuits and equipment.

After circuit board 36 is positioned on the support 26, second opening 24 is completely closed by a cap 18 which has a first end portion 28 corresponding in size and configuration to said second opening 24. Cap 18 comprises at least one and preferably a pair of arms, such as arms 32A and 32B extending from cap 18 first end portion 28, as shown in FIG. 5. Arms 32A and 32B project into the container 12 when cap 18 is in closing relationship to second opening 24. Arms 32A and 32B positively and fixedly position the circuit components 33 in their predetermined relationship within the container 12. Specifically, arms 32A and 32B engage an edge 38 of circuit board 36, as shown in FIG. 3, to prevent circuit board 36 from moving along or off support 26 when cap 18 is in closing relationship to second opening 24. Arms 32A and 32B are positioned so that regardless of the orientation of cap 18 when it is inserted into opening 24, at least one of the arms 32A, 32B will engage edge 38. Each arm 32A and 32B contains an aperture 34, the significance of which will be explained later. Arms 32A and 32B also include cylindrical reinforcement ribs 35, integrally molded with the arms to give arms 32 additional strength.

A second end portion 30 of cap 18 defines a recessed area 40 as seen in FIG. 8. This recessed area 40 can be used to receive identification decals (not shown) to identify the components contained within the encapsulating apparatus 10, since visual inspection of the components is not possible once the apparatus is assembled.

Cap 18 is bonded in closed relationship with respect to second opening 24 by a quick drying epoxy or glue 50, by ultrasonic welding, or other suitable means. This enhances the speed by which the entire encapsulating mechanism can be assembled.

After cap 18 has been fitted into second opening 24, container 12 is oriented with neck 20 upmost, and container 12 and neck 20 are then filled with a potting compound 44, preferably a liquid which hardens into a solid, such as sold under the trademark Scotchcast 4 by 3M Company, or the equivalent. The interior of neck 20 is filled to the approximate top of the neck 20. When the potting compound 44 has hardened, the assembly operation is complete.

When the potting compound 44 is injected into the encapsulating container 12, it encircles arms 32A and 32B and passes through the arm apertures 34 before it hardens. After potting compound 44 has hardened, cap 18 is virtually inextricably locked into place in second opening 24. This results in a protective sealed container which is waterproof, dustproof, acid proof, and explosive proof. Any attempts to remove cap 18 from container 12 requires shearing of the potting compound 44 encircling arms 32A and 32B and passing through arm apertures 34.

With prior art apparatus the force of the potting compound being injected into the housing tends to displace the electrical circuit elements. Because of this displacement, circuit wires can be weakened or broken and connections pulled apart, thereby damaging the circuit. In an effort to limit this damage, attempts have been made to reinforce the circuit wires by applying a liquid insulative coating to the circuit wires, which is allowed to harden into a solid, prior to introduction of the potting compound. With the internal support mechanism 26 and cap 18 of the present invention, displacement of the circuit elements is prevented so the additional insulative coating is not needed.

After the encapsulating apparatus 10 is assembled, neck 20 can be extended through a hole on any electrical box or bracket, such as one created by removal of a knock-out in a circuit box, and fastened thereto by a matching lock nut. However, the integrity of the encapsulating apparatus 10 permits its installation within an electrical circuit box without the need to fasten it to the box. This adaptability greatly simplifies the use of this apparatus with any existing installation.

As can be seen in FIGS. 1-8, it is preferred that container 12 be of a generally elongated rectangular shape with first opening 22 and second opening 24 aligned with its longitudinal axis. Second opening 24 is defined as a square opening, for receiving a square first end portion 28 of cap 18. In this manner, cap 18 having a pair of parallel arms 32A and 32B defining apertures 34, may close second opening 24 with the arms 32A and 32B either horizontally or vertically oriented.

It is also preferred that the container 12 and cap 18 be composed of plastic such as manufactured by Borg Warner under the trademark ABS KGW or similar high impact electrical insulating material which is resistant to mechanical stress. A color may be added to the plastic material to further aid in identifying the circuit components contained therein.

The method for encapsulating an electrical circuit having a plurality of discrete electrical components connected electrically to each other and to external electrical lead lines, as disclosed above, comprises of the steps of:

(1) providing an imperforately walled hollow container 12 defining oppositely disposed first and second openings 20 and 24 through its wall, and having an internal support mechanism 26 for receiving and positioning a carrier (circuit board 36) with the electrical components 33 in a predetermined relationship to the container 12 and to each other, with the lead lines 46 extending outwardly through the first opening;

(2) guiding the carrier 36 through the housing second opening 24 and into engagement with the support mechanism 26 to achieve a predetermined relationship of the components 33 with respect to each other and with respect to the container 12;

(3) closing and sealing the second opening 24 with a cap 18 having at least one irregularly shaped arm 32A,32B projecting into the container 12 when the cap 18 is in closing relationship to the second opening 24, to positively fixedly position the carrier 36 and the components 33 in the predetermined relationship; and (4) filling the container with a fluid applied, rigid hardening potting compound 44 for inextricably encompassing the fixedly positioned circuit components 33 and the arms 32A,32B to permanently fix and insulatively seal the circuit components 33 within the container 12.

The method described above also preferably includes the step of applying a circuit component identifying decal (not shown) to the exterior surface 40 of the cap 18.

This apparatus is particularly useful as an encapsulator for heat generating electrical components, such as a varistor. A varistor has a characteristic of changing its electrical impedance from a relatively high to a relatively low value whenever a certain voltage is exceeded and is used to protect against the electrical transients which exceed normal operating levels. These transients are frequently induced by the connection and disconnection of large electrical loads of the user's equipment or of the equipment of other users which are coupled into the user's electrical circuits by common transformers and primary electrical circuits. Elimination of such surges is important because many solid state circuit elements are highly voltage sensitive and are easily damaged by such surges. The reductions of the physical size of electrical motors by the use of thinner insulation on the wire used in field and armature windings has decreased proportionately the amount of transient overvoltage needed to puncture the insulation, creating a greater need for the use of varistors.

The encapsulating apparatus of the present invention insulates the varistors from the environment (both electrically and mechanically) and insulates other circuits and components adjacent the encapsulator from the heat generated by the varistors when voltage surges pass through the encapsulated varistor circuit.

It will also be apparent to those skilled in the art that a number of other modifications and changes can be made without departing from the spirit and scope of the present invention. Therefore, it is to be understood that the invention is not to be limited except by the claims which follow.

I claim:

1. Encapsulating means for protecting an electrical circuit, the electrical circuit comprising a carrier and a plurality of discrete electrical components supported by the carrier and connected electrically to each other and to external electrical lead lines, the encapsulating means comprising:
   a walled container means having a first opening in a first wall and a second opening in an oppositely disposed second wall, the container means further comprising internal support means for receiving and positioning the carrier in a predetermined relationship to the container means, with the lead lines extending out of the container means through the first opening;
   cap means for completely closing the second opening, the cap means including at least one arm means projecting into the container means when the cap means is in closing relationship to the second opening, to positively fixedly position the carrier in the predetermined relationship;
   means for holding the cap means in closed relationship with respect to the second opening; and
   potting means introduced into the container means interior to inextricably encompass the fixedly positioned electrical circuit and arm means to permanently fix and seal the electrical circuit within the container means, wherein the potting means is applied as a fluid and hardens rigidly.

2. The encapsulating means of claim 1 wherein the container means further comprises an outwardly projecting externally threaded neck coincident with the first opening.

3. The encapsulating means of claim 2 wherein the arm means is an arm member having at least one aperture therein.

4. The encapsulating means of claim 3 wherein the container means is an elongated rectangularly shaped box, with the first and second openings being aligned with the longitudinal axis of the box.

5. The encapsulating means of claim 2 wherein the internal support means is substantially axially aligned with the first opening and second opening and tangential to the periphery of the container means neck.

6. The encapsulating means of claim 5 wherein the carrier is a circuit board to which the components are attached, and the internal support means is a pair of substantially parallel flanges integrally molded on an inner wall surface of the container means and arranged to receive the circuit board slid between and along the parallel flanges until the circuit board abuts the first wall.

7. The encapsulating means of claim 6 wherein the substantially parallel flanges are tapered so that a gap created between the flanges narrows between the container means second opening and first opening, the gap adjacent the first opening being slightly narrower than a thickness of the circuit board such that the flanges tightly grasp the circuit board therebetween.

8. The encapsulating means of claim 1 wherein the container means and cap means are formed of high impact electrical insulating material which is resistant to mechanical stress.

9. The encapsulating means of claim 8 wherein the container means and cap means are composed of plastic.

10. Encapsulating means for protecting an electrical circuit, the electrical circuit comprising a carrier and a plurality of discrete electrical components supported by the carrier and connected electrically to each other and to external electrical lead lines, the encapsulating means comprising:
    container means for encapsulating the electrical circuit, the container means having a first and a second opening, the container means further including a pair of spaced flanges disposed within the container means for receiving and positioning the carrier in a predetermined relationship to the container means, with the lead lines extending outwardly through the first opening;
    a cap for completely closing the second opening, the cap including at least one arm means for fixing the carrier in the predetermined relationship, the arm means arranged to engage the carrier within the container means when the cap is in closing relationship to the second opening;
    bonding means for holding the cap in closed relationship with respect to the second opening; and
    potting means for permanently fixing and sealing the electrical circuit within the container means and the cap in closed relationship to the second opening, the potting means being introduced into the container means as a fluid which hardens rigidly.

11. The encapsulating means of claim 10 wherein the container means has a longitudinal axis and wherein the first and second openings are oppositely disposed and aligned with the longitudinal axis of the container means.

12. The encapsulating means of claim 11 wherein flanges are substantially parallel to each other and the container means longitudinal axis, the flanges being integrally molded as part of inner surfaces of the container means.

* * * * *